United States Patent [19]

Jensen

[11] Patent Number: 5,124,958

[45] Date of Patent: Jun. 23, 1992

[54] DIGITAL TAU SYNTHESIZER

[75] Inventor: Don C. Jensen, Chandler, Ariz.

[73] Assignee: Motorola, Inc., Schaumburg, Ill.

[21] Appl. No.: 591,184

[22] Filed: Oct. 1, 1990

[51] Int. Cl.⁵ .................. G04F 8/00; H03K 5/159
[52] U.S. Cl. ............................. 368/120; 328/55
[58] Field of Search .............. 368/113, 118–120; 328/55, 59, 66; 331/18, 25

[56] References Cited

U.S. PATENT DOCUMENTS

| | | | |
|---|---|---|---|
| 4,407,588 | 10/1983 | Arich et al. | 368/118 |
| 4,516,861 | 5/1985 | Frew et al. | 368/120 |
| 4,657,406 | 4/1987 | Yaeda | 368/120 |
| 4,947,382 | 8/1990 | Lesea | 368/118 |
| 4,982,387 | 1/1991 | Trent | 368/117 |

*Primary Examiner*—Vit W. Miska
*Attorney, Agent, or Firm*—Frank J. Bogacz

[57] ABSTRACT

A digital synthesizer using Tau (time) synthesis. The digital Tau synthesizer employs a time accumulator to accumulate reference periods at the rising edge of each reference clock signal. The accumulator is then constrained to count reference pulses modulo Tp (the programmed period). The accumulated time is then used to gate out the pulse that occurs just before the desired time and to set up a delay line with the appropriate values for this delay.

16 Claims, 3 Drawing Sheets

DIGITAL TAU SYNTHESIZER

BACKGROUND OF THE INVENTION

The present invention pertains to digital synthesizers and more particularly to a digital time synthesizer for generating digital clock frequencies which are highly stable and have low spurious signal content at relatively high output frequencies.

Periodic waveforms have been produced by direct digital synthesizers and numerically controlled oscillators. These direct digital synthesizers or numerically controlled oscillators typically include a phase accumulator, a SINE wave read only memory, and a digital-to-analog converter. Digital-to-analog converters produce significant spurious signal content. Precision communication equipment, radar or test equipment, for example, require low spurious signal content.

Accordingly, it is an object of the present invention to provide a digital Tau synthesizer including a time accumulator to produce high precision periodic waveforms having low spurious signal content.

SUMMARY OF THE INVENTION

In accomplishing the object of the present invention, a novel digital Tau synthesizer is shown.

A digital frequency synthesizer for producing a low spurious signal content periodic signal includes a source of a reference frequency, a source of a first binary number, and a source of a second binary number. The first binary number represents the negative of the period of the reference frequency. The second binary number represents the period of the signal to be produced added to the first binary number.

The digital frequency synthesizer includes a time accumulator. The time accumulator is coupled to the sources of the first and second binary numbers. The time accumulator counts down the second binary number in response to the reference frequency to provide a third binary number. A programmable delay is also included which is coupled to the time accumulator and to the source of the reference frequency. The programmable delay operates to delay the reference frequency by a variable amount equal to the third binary number in order to produce the low spurious content periodic signal.

The above and other objects, features, and advantages of the present invention will be better understood from the following detailed description taken in conjunction with the accompanying drawings.

DESCRIPTION OF THE PREFERRED EMBODIMENT

Figure 1:
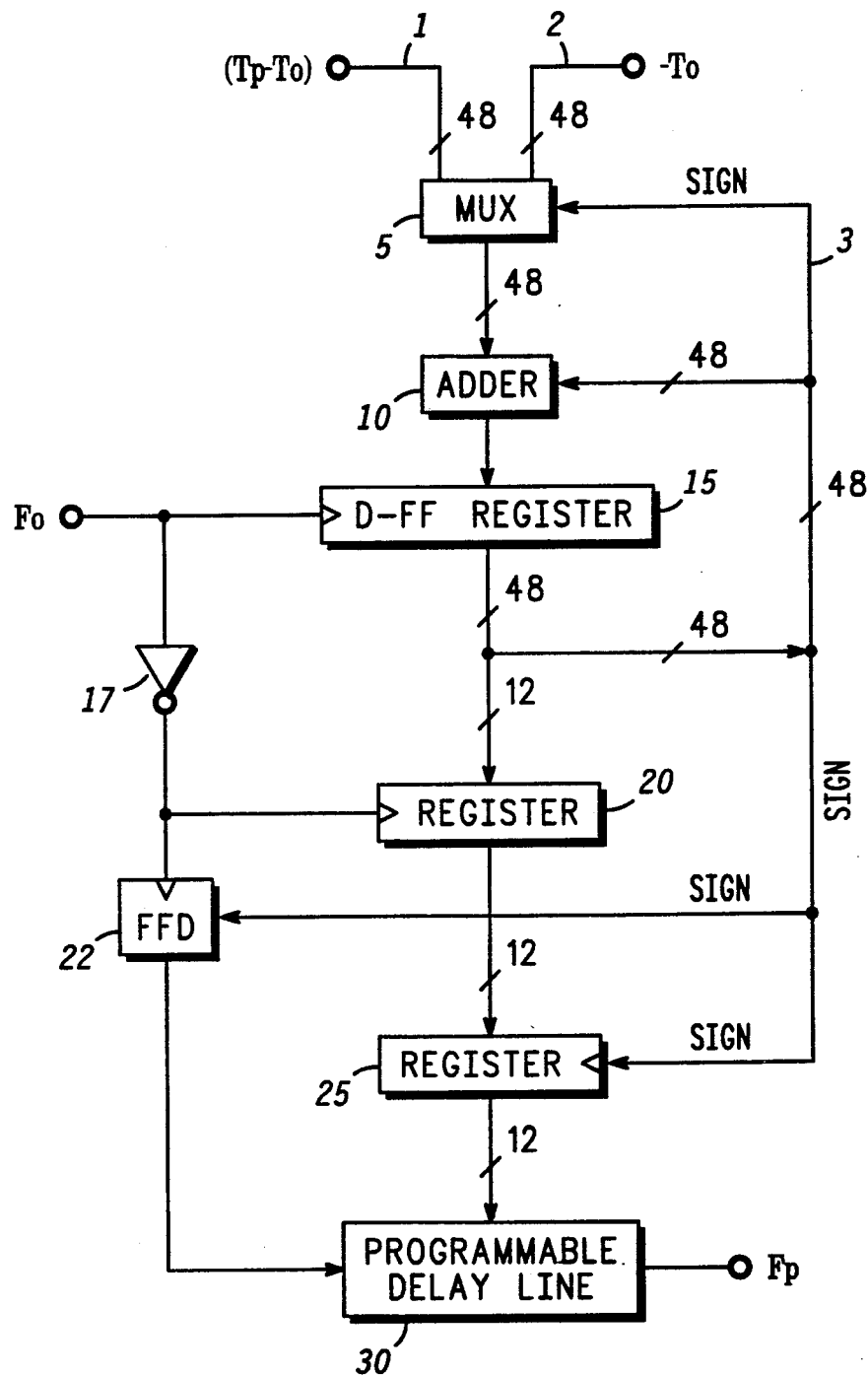
FIG. 1 is a block diagram depicting the principles of operation of the present invention.

Referring to FIG. 1, a block diagram of a digital Tau synthesizer is shown. Multiplexer (MUX) 5 is connected to adder 10. MUX 5 and adder 10 are further connected via lead 3 which represents the SIGN bit. Adder 10 is connected to D-type flip-flop register 15.

Another input to register 15 is the reference clock $F_0$. Register 15 produces, in this preferred embodiment, a 48-bit parallel output which is transmitted to adder 10 via a 48-bit bus. The 12 most significant bits of this output are transmitted to register 20 via a 12-bit bus.

The reference clock $F_0$ is also transmitted to inverter 17. Inverter 17 is connected to the clock input of register 20 and to the clock input of flip-flop 22. The data input to flip-flop 22 is the SIGN bit transmitted by register 15. Register 20 is connected to register 25 via a 12-bit bus. The SIGN bit which is also transmitted to flip-flop 22 as data input is transmitted to register 25 as the clock input. Register 25 is connected to programmable delay line 30 via a 12-bit bus. The output of flip-flop 22 is connected to the input of programmable delay line 30. $F_P$ is the desired output signal whose frequency is represented by $1/T_P$.

$F_0$ is the reference clock input to this circuitry. Minus $T_0$ is a binary word representing the two's complement of the period of $F_0$. $T_P$ is a binary word representing the desired period of the output $F_P$. $F_P$ is a pulse train with period set by $T_P$.

Adder 10 and D flip-flop register 15 form an accumulator that counts down by $T_0$ for each leading clock edge of $F_0$.

Figure 2:
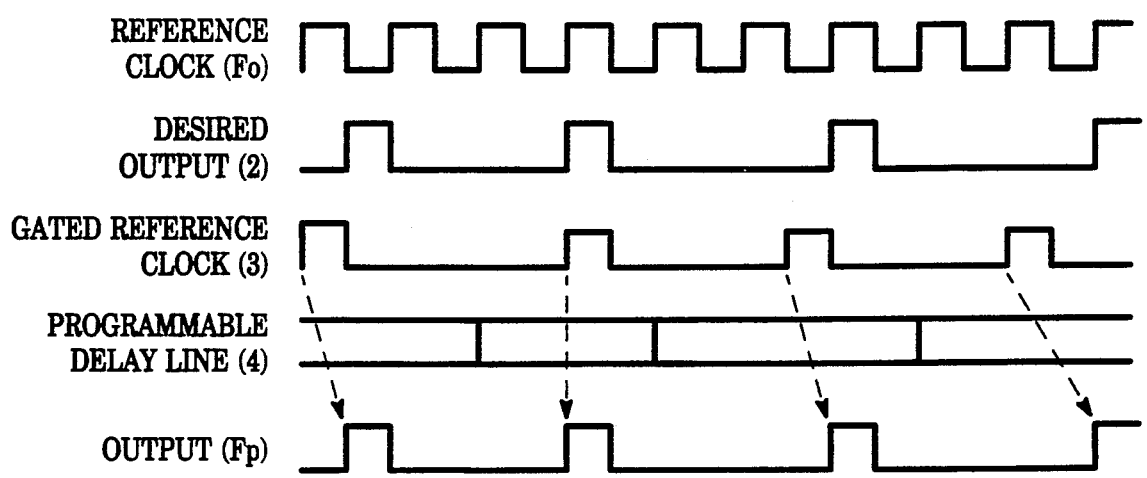
FIG. 2 is a timing diagram of various waveforms of the circuitry of FIG. 1.

FIG. 2 is a timing diagram of the operation of the circuitry of FIG. 1. The reference clock ($F_0$) is shown. The desired output waveform 2 is shown beneath the reference clock. The gated reference clock waveform 3 is the output of flip-flop 22. The input to programmable delay line 30 is shown in waveform 4. If prior to the arrival of the gated reference clock, the programmable delay line 30 has been programmed by register 25 with the appropriate delays, then the output pulses $F_P$ waveform will be that as shown in FIG. 2 which is the same as the desired output waveform 2 of FIG. 2.

Figure 3:
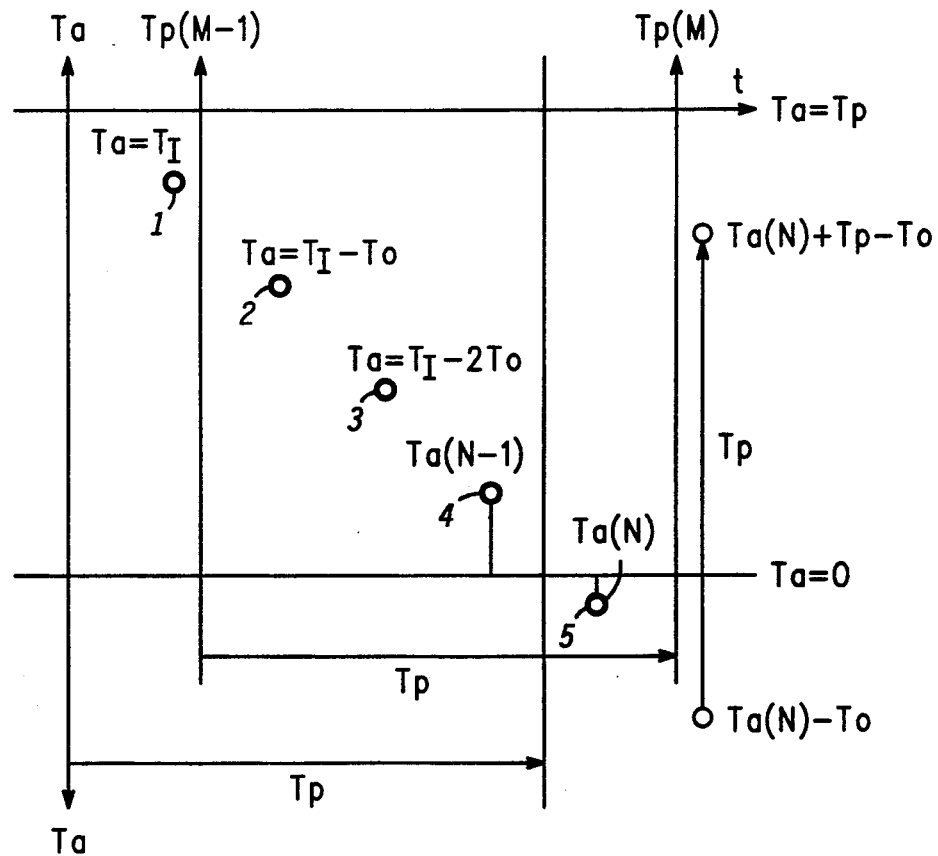
FIG. 3 is a timing chart showing the operation of the time accumulator of the present invention.

FIG. 3 is a graphic representation of the activity of the accumulator comprising register 15 and adder 10. This accumulator counts down by $T_0$ for each leading clock edge of $F_0$. The Greek letter Tau will be represented by T. The horizontal line indicated by small t is the timeline. The value of this timeline small t is $T_A = T_P$ which is the period of the output $F_P$. $T_A$ is the value of the accumulator comprising adder 10 and register 15. The lower horizontal line of FIG. 3 is $T_A = 0$. As $T_A$ crosses this zero line moving downward, the accumulator produces its output. For each leading edge of $F_0$, register 15 is clocked and the value of the accumulator comprising adder 10 and register 15 accumulates $-T_0$ modulo $T_P$ so that the SIGN bit of the accumulator toggles at a rate of $1/T_P$ or $F_P$. In addition, this accumulator contains the desired time delay prior to the next $F_0$ pulse of the reference clock.

When the value of the accumulator $T_A$ becomes negative, the SIGN bit goes high and multiplexer 5 selects the input ($T_P - T_0$) instead of the input $-T_0$. As can be seen from FIG. 3, for each down count the value of $T_A$ is decreased. $T_A$ moves from its initial value of $T_I$ to $T_I - T_0$ reference coordinate point 2. On the next clock cycle of $F_0$, the value of $T_A$ is down counted again to coordinate position 3, then coordinate position 4 which is $T_A(N-1)$. The next trailing edge of the reference clock causes register 20 to be clocked through inverter 17. This transfers the twelve most significant bits from register 15 which contains the binary value of $T_A(N-1)$ to register 20. On the leading edge of the next reference clock $F_0$, $T_A$ goes negative coordinate point 5, $T_A(n)$, and the SIGN bit goes high as mentioned above. As a result, multiplexer 5 selects input ($T_P-T_0$) instead of input $-T_0$. On the next leading edge of reference clock $F_0$, the accumulator register 15 is set to a value of $T_A(N)+T_P-T_0$ and modulo $T_P$ addition again occurs. Also, when the value of accumulator register 15 becomes negative, the SIGN bit goes high causing register 25 to be clocked. This transfers the contents of register 20 which is a 12-bit parallel value representing ($T_A(N-1)$) to register 25 which programs programmable delay line 30. On the next trailing edge of the reference clock, the SIGN bit which is the input to flip-flop 22 becomes the output of flip-flop 22. On the next leading edge of reference clock $F_0$, the value of accumulator register 15 becomes positive, and the SIGN bit goes low. On the next falling edge of reference clock $F_0$, the output of flip-flop 22 also goes low. The pulse created at the output of flip-flop 22 which is gated reference clock waveform 3 of FIG. 2 lasts one reference period. This pulse is input to programmable delay line 30 and delayed by the programmed time $T_A(N-1)$. Thereby, appropriate pulses of the output are delayed in time as can be seen from the transition from the gated reference clock waveform 3 of FIG. 2 to the output $F_P$ as shown in FIG. 2.

This digital Tau synthesizer may be used in any application where precise and low spurious frequency synthesis is required, such as communication equipment, radar or test equipment. Due to the digital nature of the present circuit it may be a radiation hardened integrated circuit and as such is suitable for use in space applications such as a global positioning system. The present circuitry may be implemented with gallium arsenide (GaAs) or emitter coupled logic (ECL) technology.

Referring to FIG. 1, the multiplexer 5 may be implemented with F100K logic. Multiplexer 5 may comprise a 48-bit 2-to-1 multiplexer employing F100155-type gates. Forty-eight-bit adder 10 may be implemented using eight 6-bit adders such as integrated circuit No. F100180 and two look-ahead carry generators Part No. F100179. D-type flip-flop register 15 may be implemented by eight 6-bit D-type flip-flops (Part No. F100151). D-type flip-flop register 15 operating in conjunction with adder 10 creates a time accumulator. Registers 20 and 25 may each comprise two 6-bit D-type flip-flops which are used to store the time delay for the programmable delay line 30. These registers may also be implemented with 6-bit D-type flip-flops Part No. F100151.

Programmable delay line 30 may be implemented with 9 quint NOR gates Part No. F100102 and fixed lengths of coaxial cable forming binarily weighted delay lines.

The accuracy of the digital Tau synthesizer is determined by the reference signal ($F_0$), the time accumulator (adder 10 and register 15), and the programmable delay line 30. Spurious signal performance is markedly improved over previous numerically controlled oscillator technology, mentioned above. With regard to spurious signals, the performance of the present invention provides spurious signals which are approximately 50 dB less than the spurious levels produced by previous technology.

In order to determine the error induced by the limitation of the number of bits used in the time accumulator, the following analysis is presented.

The period is reproduced using the time accumulator. N-bits of the period are used. Find the error in the frequency due to truncation.

If accumulator resolution is $T_s$ then the error in the representation of the period is $T_e = +/- T_s/2$.

The accumulator frequency is:

$$\begin{aligned} F &= 1/(T_0 + T_e) \\ &= 1/T_0 - T_e/[T_0(T_0 + T_e)] \end{aligned}$$

Since the desired frequency is: $F_0 = 1/T_0$
The frequency error is:

$$F_e = -T_e/[T_0(T_0+T_e)]$$

The error of the time accumulator is found from the number of bits as follows:

$$T_0 = (T_s)2^n$$

$$T_0 = (T_e)2^{(n+1)}$$

$$T_e = T_0/2^{(n+1)}$$

Where n is the number of bits in the time accumulator.

Solving for the frequency error in terms of the accumulator size:

$$\begin{aligned} F_e &= 1/[T_0(2^{(n+1)} + 1)] \\ &= F_0/(2^{(n+1)} + 1) \end{aligned}$$

For example:
$F_0 = 10.23$ MHz
$n = 48$ Bits
Then:
$F_e = 0.018$ uHz

Spurious signals are produced by phase jitter in the output. An approximation of the worst-case spurious power level is given by analysis of simple sinusoidal modulation of the phase jitter:

$$\phi = wt = wA\sin(x)$$

where: A = peak jitter.

Using only the fundamental frequency of the output square wave; the power of the spurious signal relative to the fundamental tone can be determined.

$$\begin{aligned} F_0 &= B\sin(wt + \phi) \\ &= B[\sin(wt)\cos(\phi) + \cos(wt)\sin(\phi)] \end{aligned}$$

For $\phi < 1$;

$$\cos(\phi) = 1$$

$$\sin(\phi) = \phi$$

Solving for $F_0$:

$$\begin{aligned} F_0 &= B[\sin(wt) + \phi\cos(wt)] \\ &= B[\sin(wt) + wA\sin(x)\cos(wt)] \\ &= B\{\sin(wt) + wA[\sin(wt + x) - \sin(wt - x)]/2\} \end{aligned}$$

The relative voltage in each spur with respect to the fundamental voltage level is:

$$Vrel = wA/2$$

The relative spurious power is given by:

$$Pspur = 20 LOG_{10}(wA/2)$$

For example: $F_0 = 10.23$ MHz, and $A = +/- 5$ psec:

$$Pspur = -76 \, dBc$$

Figure 4:
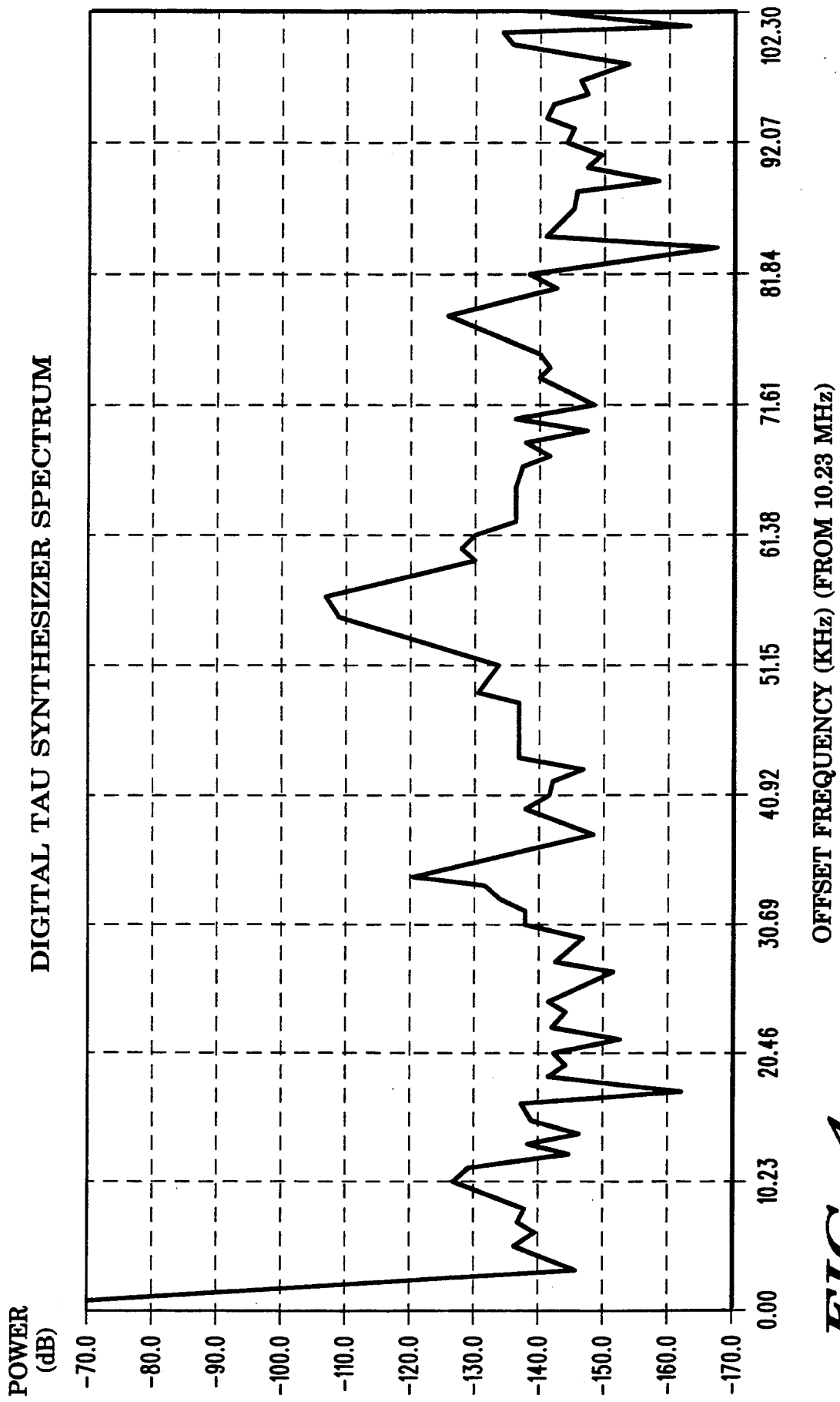
FIG. 4 is a representation of the frequency spectrum of the digital Tau synthesizer output.

A computer simulation was used to obtain the theoretical spurious output of the Digital Tau Synthesizer. The results of the simulation (see FIG. 4) which depict the conditions of the example above indicate that the actual spurious signal level is much lower than the calculated worst-case of $-76$ dBc.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A digital time synthesizer for producing a low spurious signal content periodic signal comprising:
   a source of a reference frequency;
   a source of a first binary number representing the negative of period of the reference frequency;
   a source of a second binary number representing the period of the signal to be produced added to said first binary number;
   time accumulator means coupled to said source of said first and second binary numbers, said time accumulator means counting down said second binary number in response to said reference frequency to provide a third binary number; and
   programmable delay means coupled to said time accumulator means and to said source of said reference frequency, said programmable delay means operating to delay said reference frequency by a variable amount equal to said third binary number to produce said periodic signal.

2. A digital time synthesizer as claimed in claim 1, wherein there is further included multiplexer means connected to said sources of said first and second binary numbers and to said time accumulator means, said multiplexer means operating to selectively transmit said first binary number or said second binary number.

3. A digital time synthesizer as claimed in claim 2, wherein said time accumulator means includes adder means connected to said multiplexer means, said adder means adding said first binary number and a portion of said third binary number.

4. A digital time synthesizer as claimed in claim 3, wherein said time accumulator means further includes register means connected to said adder means, to said multiplexer means and to said source of said reference frequency, said register means for counting down said reference frequency by said second binary number to produce said third binary number including a n-bit wide parallel output and a SIGN bit.

5. A digital time synthesizer as claimed in claim 4, wherein there is further included first intermediate register means coupled to said source of said reference frequency and to said register means via a n-bit wide parallel bus for receiving said n-bit wide parallel output.

6. A digital time synthesizer as claimed in claim 5, wherein there is further included means for inverting connected between said source of said reference frequency and said first intermediate register means.

7. A digital time synthesizer as claimed in claim 5, wherein there is further included second intermediate register means connected to said first intermediate register means via a second n-bit wide parallel bus and to said register means and to said programmable delay means, said second intermediate means for transmitting the m-most significant bits of said n-bits to said programmable delay means.

8. A digital time synthesizer as claimed in claim 4, wherein there is further included latching means having a clock input connected to said means for inverting, a data input connected to said register means via said SIGN bit and an output connected to said programmable delay means.

9. A digital time synthesizer as claimed in claim 8, wherein said programmable delay means includes a programmable delay line having a data input and an m-bit wide programmable input and an output, said programmable delay line having said input connected to said output of said latching means, said m-bit wide input of said programmable delay line being connected to said output of said second intermediate register means and said programmable delay line producing said low spurious signal content periodic signal.

10. In a communication system, a digital time synthesizer for producing a low spurious content periodic output signal comprising:
    a digital time synthesis circuit including:
      a source of a reference frequency;
      a source of a first binary number representing the negative of period of the reference frequency;
      a source of a second binary number representing the period of the signal to be produced added to said first binary number;
      time accumulator means coupled to said source of said first and second binary numbers, said time accumulator means counting down said second binary number in response to said reference frequency to provide a third binary number; and
      programmable delay means coupled to said time accumulator means and to said source of said reference frequency, said programmable delay means operating to delay said reference frequency by a variable amount equal to said third binary number to produce said periodic signal.

11. A digital time synthesizer as claimed in claim 10, wherein said time accumulator means includes digital time accumulator means.

12. A digital time synthesizer as claimed in claim 10, wherein said programmable delay means includes digital programmable delay line means.

13. In a global positioning system, a digital time synthesizer for producing a low spurious content periodic output signal comprising:
    a digital time synthesis circuit including:
      a source of a reference frequency;
      a source of a first binary number representing the negative of period of the reference frequency;
      a source of a second binary number representing the period of the signal to be produced added to said first binary number;

time accumulator means coupled to said source of said first and second binary numbers, said time accumulator means counting down said second binary number in response to said reference frequency to provide a third binary number; and programmable delay means coupled to said time accumulator means and to said source of said reference frequency, said programmable delay means operating to delay said reference frequency by a variable amount equal to said third binary number to produce said periodic signal.

14. A digital time synthesizer as claimed in claim 13, wherein said digital time synthesis circuit comprises a radiation hardened integrated circuit.

15. A digital time synthesizer as claimed in claim 13, wherein said digital time synthesis circuit is a gallium arsenide integrated circuit.

16. A digital time synthesizer as claimed in claim 13, wherein said digital time synthesis circuit is an emitter coupled logic integrated circuit.

* * * * *